United States Patent [19]

Krumenacher

[11] Patent Number: 5,381,508
[45] Date of Patent: Jan. 10, 1995

[54] SUCTION AND LIGHT GUIDE ASSEMBLY

[76] Inventor: Paul F. Krumenacher, 25124 W. Lakeshore Dr., Ingleside, Ill. 60041

[21] Appl. No.: 111,842

[22] Filed: Aug. 25, 1993

[51] Int. Cl.⁶ .............................................. G02B 6/00
[52] U.S. Cl. ...................................... 385/147; 385/78; 385/117; 385/901
[58] Field of Search ....................... 385/12, 26, 75, 76, 385/77, 78, 84, 85, 66, 68, 92, 94, 100, 117, 118, 133, 147, 901, 902

[56] References Cited

U.S. PATENT DOCUMENTS

| Re. 33,974 | 6/1992 | Asai et al. | 29/407 |
|---|---|---|---|
| 4,707,075 | 11/1987 | Fukushima et al. | 385/117 |
| 4,740,136 | 4/1988 | Asai et al. | 414/787 |
| 4,747,198 | 5/1988 | Asai et al. | 29/407 |
| 4,778,247 | 10/1988 | Carpenter | 385/117 |
| 4,836,131 | 6/1989 | Kataoka | 118/220 |
| 5,012,115 | 4/1991 | Asai et al. | 250/561 |
| 5,147,348 | 9/1992 | Leckrone et al. | 606/16 |
| 5,206,921 | 4/1993 | Okada et al. | 385/134 |
| 5,207,498 | 5/1993 | Lawrence et al. | 362/91 |

Primary Examiner—Frank Gonzalez
Attorney, Agent, or Firm—Thomas R. Vigil; John G. Bisbikis

[57] ABSTRACT

The suction and light guide assembly is positionable within a vertical tube of a suction head in an electronic component holding apparatus having a transparent lower plate attached to a lower end of the vertical tube. The assembly comprises a solid elongate optical element positioned in and extending substantially the length of the vertical tube. The optical element has a top surface, a bottom surface and an outer peripheral surface. The optical element also has an axial passage within the body extending upwardly from the bottom surface part way through the optical element and at least one generally radially extending passage communicating with the axial passage and extending to the outer peripheral surface of the optical element. The optical element is positioned within the tubular member in an air-tight manner.

9 Claims, 2 Drawing Sheets

SUCTION AND LIGHT GUIDE ASSEMBLY

BACKGROUND OF THE INVENTION

1. Field of the Invention

The present invention relates to a suction and light guide assembly for use in an electronic component holding apparatus which positions electronic components to be mounted on printed circuit boards. More particularly, the suction and light guide assembly of the present invention is an improvement to a suction head which holds an electronic component to a suction tube at the lower end of the suction head in an electronic component holding apparatus manufactured and sold by Fuji Machine Manufacturing Co. of Chioryu Japan, while light is directed through the suction head for imaging the component on a screen of solid image sensors.

The suction and light guide assembly of the present invention includes a solid elongate optical element in the form of a transparent/translucent cylindrical body which is received in, and extends substantially the length of a vertically positioned tube of an existing suction head. The body has suction passages therein for directing suction to a suction tube mounted at the lower end of the vertical tube so that suction of ambient air and debris is confined to the suction passages and prevented from settling in an open, lower end of the vertical tube as occurs in prior art suction heads.

2. Description of the Related Art Including Information Disclosed Under 37 CFR §§ 1.97–1.99.

The Asai et al. U.S. Pat. No. Re 33,974 (Reissue of U.S. Pat. No. 4,474,198) discloses an apparatus for holding and mounting electronic components to a printed circuit board. The components are held by an electronic component holding apparatus. The electronic holding apparatus has a suction or holding head which includes a head body. The head body includes a tubular member and upper and lower transparent plates. A sucking pipe is press-fitted into the lower transparent plate. The upper and lower transparent plates are positioned within the tubular member, spaced from each other, creating an air-tight space within the tubular member.

A vacuum is created by the apparatus and causes air to be drawn through the sucking pipe, into the air-tight space, and out passages of the head body. An electronic component is held in place at a lower end of the sucking pipe by the vacuum. The holding apparatus has a hold position detecting device which includes a light emitter for emitting light beams in a direction parallel to the center line of the sucking pipe, creating a projection of the component held at the end of the sucking pipe. The apparatus also has an electronic image device for detecting the electronic component's projection and determining the electronic component's position.

SUMMARY OF THE INVENTION

According to the present-invention, there is provided a suction and light guide assembly positionable within a vertical tube of a suction head in an electronic component holding apparatus having a transparent lower plate attached to a lower end of the vertical tube. The suction and light guide assembly includes a solid elongate optical element which extends substantially the length of the vertical tube and which has a top surface, a bottom surface and an outer peripheral surface. The optical element has an axial passage therein extending upwardly from the bottom surface partway through the optical element. The optical element further has at least one generally radially extending passage communicating with the axial passage and extending to an outer peripheral surface of the optical element. The optical element is positioned within the tubular member in an air-tight manner.

DESCRIPTION OF THE PREFERRED EMBODIMENTS

Figure 3:
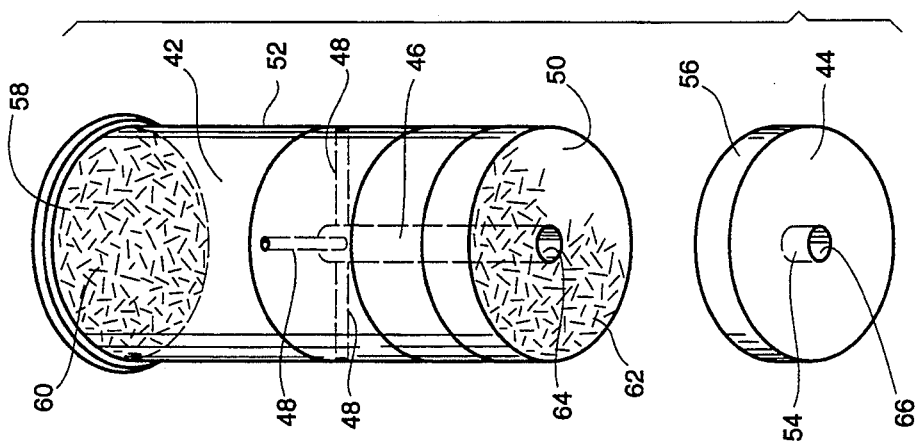
FIG. 3 is a perspective view of the suction and light guide assembly shown in FIG. 2 combined with a seal disk.

While the present suction and light guide assembly is susceptible of several constructions, there is shown in FIGS. 1–5 one preferred embodiment of the assembly constructed according to the teachings of the present invention, with the understanding that the present disclosure is not intended to be limited to the specific constructions illustrated in the drawings.

Figure 1:
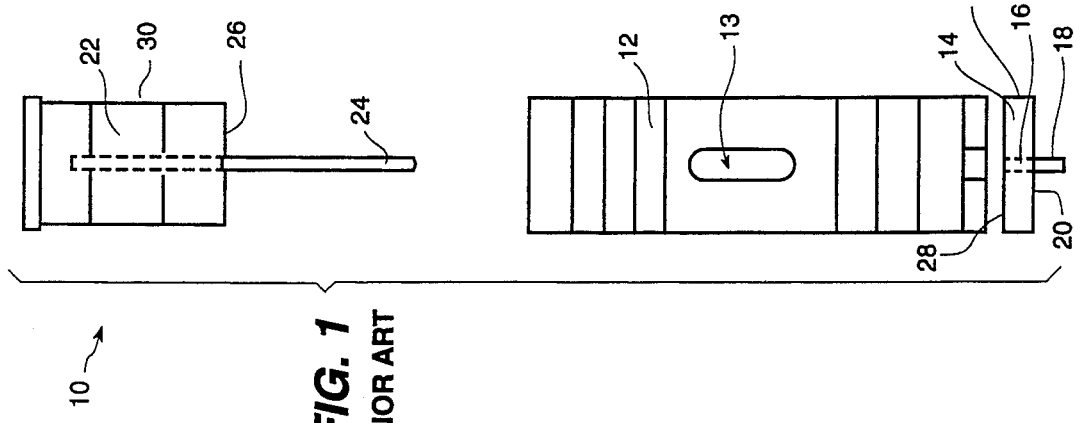
FIG. 1 is an exploded view of a prior art suction head.

An exploded view of a prior art suction head 10 currently used in a Fuji Machine Manufacturing Co. of Chioryu Japan electronic component holding apparatus is illustrated in FIG. 1. The structure, function and operation of this apparatus manufactured by the Fuji Machine Manufacturing Co. of Chioryu Japan electronic component holding apparatus is described in detail in U.S. Pat. No. Re 33,974 (Reissue of U.S. Pat. No. 4,747,198).

The prior art suction head 10 includes a hollow metal vertical tube 12 having vacuum holes 13 therethrough and a transparent lower plate 14 attached at a bottom end of the vertical tube 12. The transparent lower plate 14 has an axial bore 16 therethrough and a suction pipe 18 extending from a bottom surface 20 of the lower plate 14, in alignment with the axial bore 16.

The prior art suction head 10 also includes a transparent upper disk 22 having a shank 24 extending downwardly along a central axis of the transparent upper disk 22 from a bottom surface 26 of the transparent upper disk 22. The transparent upper disk 22 is positioned within a top end of the hollow metal vertical tube 12. The transparent upper disk 22 is made of glass or a synthetic resin.

When the transparent upper disk 22 is inserted into the vertical tube 12, the shank 24 extends substantially the length the vertical tube 12, but does not touch a top surface 28 of the transparent lower plate 14 or block the axial bore 16 of the lower plate 14. The shank merely inhibits light from exiting from the axial bore 16 of the lower plate 14, but does not inhibit light exiting through other areas of the lower plate 14.

Figure 4:
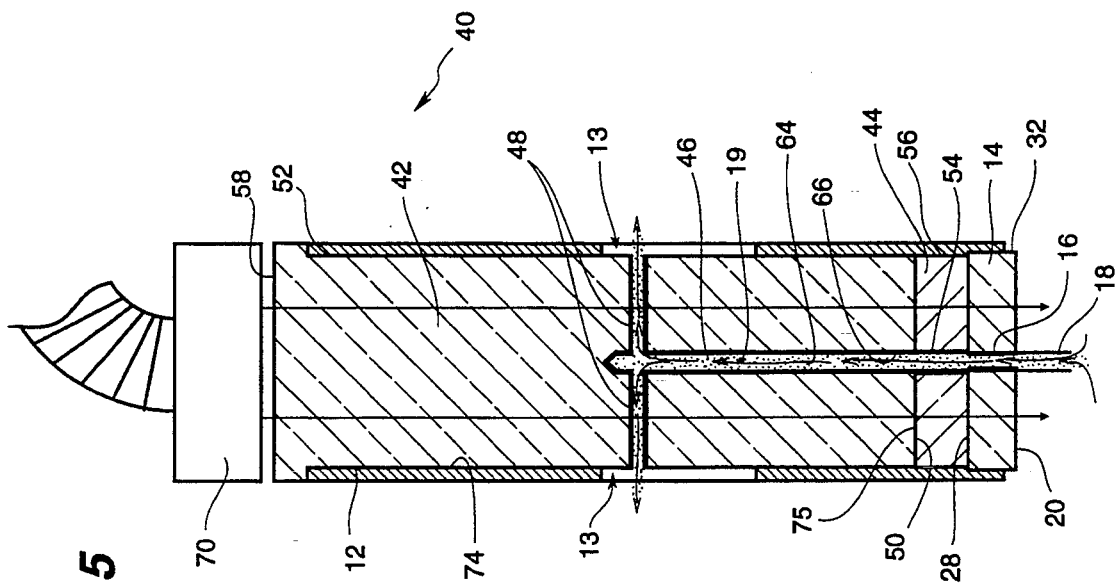
FIG. 4 is a sectional view of the assembled prior art suction head shown in FIG. 1 and shows an upper disk mounted within a vertical tube of the prior art suction head.

When assembled, as shown in FIG. 4, the transparent upper disk 22 and the lower transparent plate 14 are sealed in an air-tight manner within the vertical tube 12 around outer peripheries 30 and 32 of the transparent upper disk 22 and transparent lower plate 14.

Figure 2:
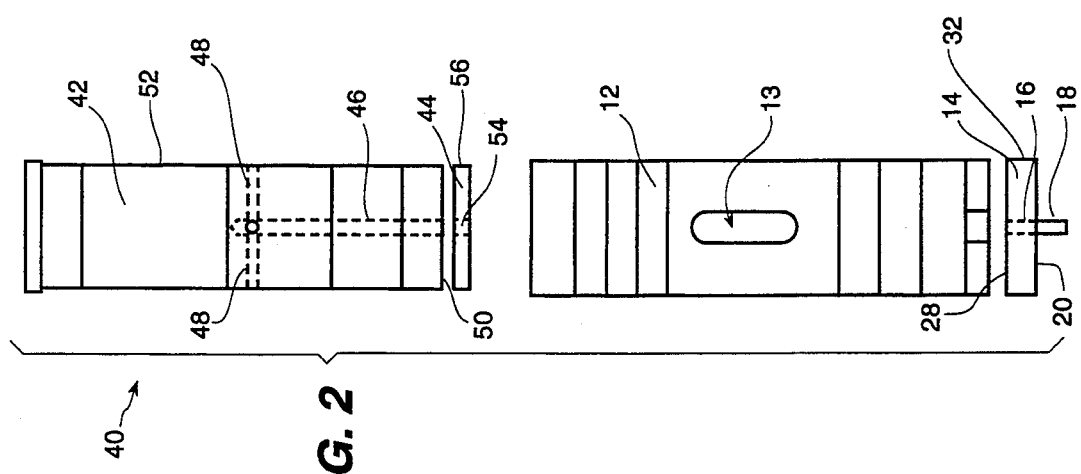
FIG. 2 is an exploded view of one embodiment of a suction and light guide assembly constructed according to the teachings of the present invention.

An exploded view of the suction and light guide assembly 40 constructed according to the teachings of the present invention is shown in FIG. 2. This assembly or suction head 40 includes a solid, elongate optical element 42, which is realized by a transparent cylindrical body 42, and a transparent seal disk 44 which are positioned within the existing vertical hollow tube 12. The optical element 42 is preferably made of cast acrylic and the seal disk 44 is preferably made of clear PVC.

The optical element 42 has an axial passage 46 and at least one radial passage 48 therethrough. The axial passage 46 extends partway through the optical element 42 from a bottom surface 50 of the body 42. The radial passage 48, preferably four equally spaced apart passages 48 communicate with the axial passage 46 and extend to an outer periphery 52 of the optical element 42. The seal disk 44 has an axial bore 54 therethrough in alignment with the axial passage 46 of the transparent cylindrical body 42.

Figure 5:
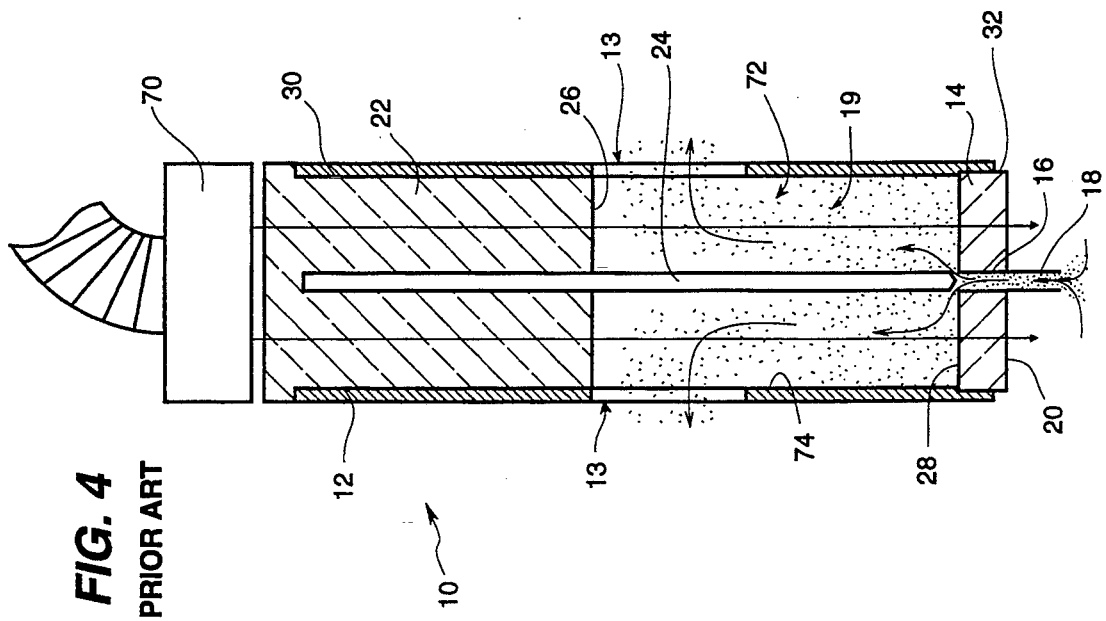
FIG. 5 is a sectional view of the assembled suction and light guide assembly of the present invention shown in FIG. 2 and shows a seal disk positioned within a vertical tube of the assembly.

When the suction head 40 is assembled, as shown in FIG. 5, the optical element 42 and the seal disk 54 are sealed in an airtight manner at the outer periphery 52 of the optical element and at an outer periphery 56 of the seal disk 54 to the inner surface of the tube 12.

FIG. 3 is a perspective view of the suction and light guide assembly shown in FIG. 2. In this view, top and bottom surfaces 58 and 50 of the optical element 42 have scored lines 60 and 62, making the top and bottom surfaces 58 and 50 translucent.

An inner surface 64 of the axial passageway 46 and an inner surface 66 of the axial bore 54 of the seal disk 44 are coated with dark paint. The dark paint prohibits light from entering the axial passage 46 or the axial bore 54 of the seal disk 44, but still allows light to pass through the rest of the disk 44.

In the Fuji Machine Manufacturing Co. of Chioryu Japan apparatus, described in U.S. Pat. No. Re 33,974, it is essential to create a dark center point when light is passed through the suction head 10 or 40, as the dark center point is a reference for the electronic component holding apparatus when the apparatus is initially powered on and executes a self calibration to determine the location of each suction head. Light is prevented from exiting the axial bore 16 of the lower plate 14 in the present embodiment by coating the inner surfaces 64 and 66 of the passages 46 and 54 with dark paint, whereas in the prior art, the shank 24 inhibited light from exiting the axial bore 16 of the transparent plate 14.

FIG. 4 shows the prior art suction head as assembled within the apparatus manufactured by the Fuji Machine Manufacturing Co. of Chioryu Japan and also shows (a) the direction of the light which passes through the suction head 10 and (b) the direction of vacuum flow through the suction head 10.

The transparent upper disk 22 is sealed in an air-tight manner around the periphery 30 of the disk 22 within the hollow vertical tube 12. The transparent lower plate 14 is sealed at a lower end of the tube 12, also in an air-tight manner around the periphery 32 of the lower plate 14. Light beams are emitted from a light source 70 located at the top of the suction head 10. The light beams pass through the upper disk 22, through an open chamber 72 defined between the bottom surface 26 of the upper disk 22, an inner wall 74 of the hollow vertical tube 12 and the top surface 28 of the transparent lower plate 14, and exits the suction head 10 through the transparent lower plate 14.

The open chamber 72 communicates with ambient air via the suction pipe 18 and the axial bore 16 of the lower plate 14. When a vacuum is created around the suction head 10, air is drawn through the suction tube 10, through the bore 16 of the transparent lower plate 14, around the shank 24, into the open chamber 72 and exits the open chamber 72 via the vacuum holes 13 of the hollow vertical tube 12. Along with air being drawn in through the suction pipe 18, some ambient debris 19 is also drawn through the suction pipe 18 into the open chamber 72. Some of the ambient debris 19 drawn in exits the suction head 10 through the vacuum holes 13 of the vertical tube 12, but some of the ambient debris 19 settles on the top surface 28 of the lower transparent plate 14.

Any debris 19 that settles on the top surface 28 of the transparent lower plate 14 corrupts the integrity of the light passing through the transparent lower plate 14 and can eventually cause an imaging device (not shown) to give a false reading or can cause an erroneous calibration of the apparatus.

The problem of the ambient debris 19 settling on the transparent lower plate 14 is eliminated with the suction and light guide assembly 40 of the present invention shown in FIG. 5.

The vertical tube 12 and the transparent lower plate 14 attached to the bottom end of the vertical tube 12 are sealed in an air-tight manner in the same manner as in the prior art suction head shown in FIG. 4. However, the open chamber 72 of FIG. 4 is eliminated by placing the transparent seal disk 56 within the vertical tube 12, in contact with the top surface 28 of the transparent lower plate 14, and then placing the solid optical element 42 within the vertical tube 12, in contact with a top surface 75 of the seal disk 44. The optical element 42 must be rotated properly so that the radial passages 48 align with the vacuum holes 13 of the vertical tube 12. The axial passage 46 of the body 42 and the axial bore 54 of the seal disk 44 are in alignment with the axial bore 16 and suction pipe 18 of the lower plate 14, forming a continuous passage.

Light entering the optical element/cylindrical body 42 from the light source 70 is diffused by the scored lines 60 on the top surface 58 of the cylindrical body 42. Thus, diffused light is directed around the radial and axial passages 48 and 46. Light exiting the cylindrical body 42 is diffused again at the bottom surface 50 of the cylindrical body 42, and passes through the transparent seal disk 44 and transparent lower plate 14.

Since the inner surface 66 of the bore 54 of the seal disk 44 and the inner surface 64 of the axial passage 46 are coated with a dark paint, a dark spot is left in the center of the lower transparent plate 14 at the bore 16, as no light can enter the bore 16.

When a vacuum is created around the suction head 40, air is drawn through the suction pipe 18 and the bore 16 of the transparent lower plate 14. Ambient air and debris 19 then must pass through the bore 54 of the seal disk 44, the axial passage 46 of the cylindrical body 42 and the radial passages 48. Air then flows out of the radial passages 48 of the transparent/translucent body 42 and through the vacuum holes 13 of the vertical tube 12.

Any ambient debris 19 brought in along with the air through the suction pipe 18 is confined to the axial and radial passages 46 and 48 and also must flow out of the cylindrical body 42 via the vacuum holes 13. Thus, ambient debris cannot settle on the top surface 28 of the transparent lower plate 14 and cannot corrupt the integrity of the light exiting the lower plate 14. The need for cleaning the suction head is therefore eliminated, providing the electronic component holding apparatus with improved performance and less down time.

From the foregoing description, it will be apparent that the suction and light guide assembly 40 of the present invention has a number of advantages, some of which have been described above and others of which are inherent in the suction and light guide assembly 40 of the present invention. Also, it will be understood that modifications can be made to the suction and light guide assembly 40 of the present invention without departing from the teachings of the invention. Accordingly the scope of the invention is only to be limited as necessitated by the accompanying claims.

I claim:

1. A suction and light guide assembly positionable within a vertical tube of a suction head in an electronic component holding apparatus having a transparent lower plate attached to a lower end of the vertical tube, said assembly comprising:
    a solid optical element extending substantially the length of the vertical tube and having a top surface, a bottom surface and an outer peripheral surface;
    said optical element having a body and an axial passage within said body extending upwardly from said bottom surface part way through said optical element and at least one generally radially extending passage communicating with said axial passage and extending to said outer peripheral surface;
    and said optical element being received within said tubular member in an air-tight manner.

2. The suction and light guide assembly of claim 1 wherein at least one of said top surface and said bottom surface of said optical element have means for diffusing light.

3. The suction and light guide assembly of claim 2 wherein said means for diffusing light comprises a plurality of scored lines on at least one of said top surface and said bottom surface of said optical element.

4. The suction and light guide assembly of claim 1 wherein said axial passage has an opaque inner surface.

5. The suction and light guide assembly of claim 1 wherein said optical element is made of cast acrylic.

6. The suction and light guide assembly of claim 1 further comprising a seal disk positionable between said optical element and said lower transparent plate attached to a lower end of the vertical tube; said seal disk having an axial bore therethrough.

7. The suction and light guide assembly of claim 6 wherein said seal disk axial bore has an opaque inner surface.

8. The suction and light guide assembly of claim 6 wherein said seal disk is made of PVC.

9. The suction and light guide assembly of claim 1 wherein said optical element is defined by a generally cylindrical transparent body.

* * * * *